(12) United States Patent
Durukan et al.

(10) Patent No.: US 10,879,090 B2
(45) Date of Patent: Dec. 29, 2020

(54) HIGH TEMPERATURE PROCESS CHAMBER LID

(71) Applicant: Applied Materials, Inc., Santa Clara, CA (US)

(72) Inventors: Ilker Durukan, Sunnyvale, CA (US); Joel M. Huston, Los Gatos, CA (US); Dien-Yeh Wu, San Jose, CA (US); Chien-Teh Kao, Sunnyvale, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 204 days.

(21) Appl. No.: 15/795,575

(22) Filed: Oct. 27, 2017

(65) Prior Publication Data

US 2018/0053667 A1 Feb. 22, 2018

Related U.S. Application Data

(62) Division of application No. 14/204,252, filed on Mar. 11, 2014, now Pat. No. 9,831,109.

(60) Provisional application No. 61/776,239, filed on Mar. 11, 2013.

(51) Int. Cl.
*H01L 21/67* (2006.01)
(52) U.S. Cl.
CPC .... *H01L 21/67126* (2013.01); *H01L 21/6719* (2013.01)
(58) Field of Classification Search
CPC ............ H01L 21/67126; H01L 21/6719
USPC ............................................. 118/728, 723
See application file for complete search history.

(56) References Cited

U.S. PATENT DOCUMENTS

| 5,288,329 | A | 2/1994 | Nakamura et al. |
| 5,766,360 | A | 6/1998 | Sato et al. |
| 6,203,619 | B1 | 3/2001 | McMillan |
| 6,821,563 | B2 | 11/2004 | Yudovsky |
| 7,214,027 | B2 | 5/2007 | Stone |
| 7,413,982 | B2 | 8/2008 | Levy |
| 7,456,429 | B2 | 11/2008 | Levy et al. |
| 7,572,686 | B2 | 8/2009 | Levy et al. |
| 7,591,714 | B2 | 9/2009 | Ko et al. |
| 7,789,961 | B2 | 9/2010 | Nelson et al. |
| 8,252,116 | B2* | 8/2012 | Sneh .................. C23C 16/54 118/715 |
| 8,333,842 | B2* | 12/2012 | Lubomirsky ....... H01L 21/6838 118/728 |

(Continued)

FOREIGN PATENT DOCUMENTS

| EP | 0472112 A2 | 2/1992 |
| JP | 2002045683 A | 8/2000 |

(Continued)

OTHER PUBLICATIONS

English Machine Translation of KR-10-1072670, 17 pages.

(Continued)

*Primary Examiner* — Qingzhang Zhou
(74) *Attorney, Agent, or Firm* — Servilla Whitney LLC

(57) ABSTRACT

Lid assemblies for processing chamber and processing chambers including the lid assemblies are described. The lid assemblies include a high temperature lid module and a housing. The high temperature lid module being positioned adjacent a process liner of a processing chamber. The flexible housing positioned around the high temperature lid module and joined to the high temperature lid module with an elastomeric ring.

16 Claims, 5 Drawing Sheets

(56) References Cited

U.S. PATENT DOCUMENTS

| | | |
|---|---|---|
| 2003/0033978 A1 | 2/2003 | Zhao et al. |
| 2003/0168170 A1* | 9/2003 | Chen ................ H01L 21/67126 156/345.23 |
| 2004/0042152 A1* | 3/2004 | Ishizaka ........... H01L 21/67126 361/234 |
| 2004/0067641 A1 | 4/2004 | Yudovsky |
| 2004/0118345 A1 | 6/2004 | White et al. |
| 2004/0187792 A1* | 9/2004 | Parks ................ H01L 21/67751 118/733 |
| 2007/0012251 A1* | 1/2007 | Zucker .............. H01J 37/32477 118/733 |
| 2007/0157683 A1 | 7/2007 | Li |
| 2008/0014057 A1 | 1/2008 | Juergensen et al. |
| 2008/0166880 A1 | 7/2008 | Levy |
| 2008/0178797 A1 | 7/2008 | Fodor et al. |
| 2008/0193643 A1 | 8/2008 | Dip |
| 2009/0078204 A1 | 3/2009 | Kerr et al. |
| 2009/0081366 A1 | 3/2009 | Kerr et al. |
| 2009/0130858 A1 | 5/2009 | Levy |
| 2009/0217878 A1 | 9/2009 | Levy et al. |
| 2010/0050943 A1 | 3/2010 | Kato et al. |
| 2010/0055312 A1 | 3/2010 | Kato et al. |
| 2010/0116209 A1 | 3/2010 | Kato |
| 2010/0248423 A1 | 9/2010 | Nelson et al. |
| 2011/0024048 A1 | 2/2011 | Nakamura et al. |
| 2011/0147363 A1 | 6/2011 | Yap et al. |
| 2014/0252015 A1 | 9/2014 | Durukan et al. |

FOREIGN PATENT DOCUMENTS

| | | |
|---|---|---|
| KR | 10-0670762 B1 | 1/2007 |
| KR | 20-2009-0001924 U | 2/2009 |
| KR | 10-2009-0055443 A | 6/2009 |
| KR | 10-2009-0069075 A | 6/2009 |
| KR | 10-0908987 B1 | 7/2009 |
| KR | 10-0920324 B1 | 10/2009 |
| KR | 10-0931331 B1 | 12/2009 |
| KR | 10-2010-0002886 A | 1/2010 |
| KR | 10-2010-0003536 A | 1/2010 |
| KR | 10-0936694 B1 | 1/2010 |
| KR | 10-0936695 B1 | 1/2010 |
| KR | 10-0946159 B1 | 3/2010 |
| KR | 10-0949913 B1 | 3/2010 |
| KR | 10-0949914 B1 | 3/2010 |
| KR | 10-0960958 B1 | 6/2010 |
| KR | 10-1028408 B1 | 4/2011 |
| KR | 10-1072670 B1 | 10/2011 |
| KR | 10-1081694 B1 | 11/2011 |
| KR | 10-1095687 B1 | 12/2011 |
| KR | 10-1134277 B1 | 4/2012 |
| KR | 10-1135853 B1 | 4/2012 |
| KR | 10-1136302 B1 | 4/2012 |
| TW | 201125069 A | 7/2011 |
| TW | 613412 B | 2/2018 |

OTHER PUBLICATIONS

English Machine Translation of KR-10-1081694, 14 pages.
English Machine Translation of KR-20-2009-0001924, 10 pages.
PCT International Preliminary Report on Patentability in PCT/US2014/023377, dated Sep. 24, 2015, 8 pages.
PCT International Seach Report and Written Opinion in PCT/US2014/023377, dated Aug. 8, 2014, 12 pages.

* cited by examiner

HIGH TEMPERATURE PROCESS CHAMBER LID

CROSS-REFERENCE TO RELATED APPLICATIONS

This application is a divisional of U.S. patent application Ser. No. 14/204,252, filed Mar. 11, 2014, which claims priority to U.S. Provisional Application No. 61/776,239, filed Mar. 11, 2013, the entire disclosures of which are hereby incorporated by reference herein.

BACKGROUND

The disclosure pertains to a process chamber lid. More particularly, embodiments of the disclosure are directed to process chamber lids that prevent damage to sealing materials and allow for the installation of the lid without damaging process kit components.

When the lid of the chamber is heated, elastomeric sealing materials between the chamber lid and walls are also heated. This causes the elastomeric sealing material to fail, sticking to the surface, leaking and losing shape.

In addition, while heating the lid, the chamber body, which is in contact with the lid, should remain relatively cold. Thermal differences cause the hot lid to expand and cause relative displacement of the lid with respect to the chamber body. This can created scratches and particles within the chamber.

Furthermore, to keep the process area temperature uniform, hot lid components are allowed to touch the process kit components, which will create contact between the lid and process kit components and allow thermal uniformity. However, during installation of the lid, contact can damage the process kit components.

There is an ongoing need in the art for apparatus and methods of sealing a process chamber while minimizing the effect of thermal differences between the chamber lid and chamber body.

Additionally, there is an ongoing need in the art for apparatus and methods of sealing a process chamber without allowing the chamber lid to contact, and potentially damage, the process kit components.

SUMMARY

One or more embodiments of the invention are directed to lid assembly comprising a high temperature lid module, a housing and an elastomeric sealing O-ring. The high temperature lid module has a bottom surface to be positioned adjacent a processing kit of a processing chamber and a top surface. The housing is around the high temperature lid module. The housing comprises a hollow cylindrical wall with a lower end to be positioned adjacent a processing chamber body and an upper end. The elastomeric sealing O-ring is positioned between the upper end of the hollow cylindrical wall of the housing and the top surface of the high temperature lid module. The housing is flexible to allow movement of the high temperature lid module within the housing.

In some embodiments, the hollow cylindrical wall of the housing comprises an outer hollow cylindrical wall, an inner hollow cylindrical wall, a lower annulus in contact with the outer hollow cylindrical wall and the inner hollow cylindrical wall, and an upper annulus connected to the inner hollow cylindrical wall. In one or more embodiments, the elastomeric sealing O-ring is positioned between a lower wall of the upper annulus and the top surface of the high temperature lid. In some embodiments, the outer hollow cylindrical wall, the lower annulus, the inner hollow cylindrical wall and the upper annulus are integrally formed. In one or more embodiments, the lower annulus is thinner than the outer hollow cylindrical wall, the inner hollow cylindrical wall and the upper annulus.

In some embodiments, the lower annulus, inner hollow cylindrical wall and upper annulus are integrally formed and the outer hollow cylindrical wall is separate. In one or more embodiments, the lid assembly further comprises an O-ring positioned between a top end of the outer hollow cylindrical wall and a lower surface of the lower annulus.

In some embodiments, the housing has enough flexibility to allow the movement of the high temperature lid module within the housing up to about 1 inch. In one or more embodiments, the high temperature lid module comprises a showerhead assembly including a plurality of apertures on the bottom surface.

Additional embodiments of the invention are directed to processing chambers comprising a chamber body and a chamber lid. The chamber body includes a cylindrical chamber wall with a top surface. The cylindrical chamber wall encloses a process area which includes a wafer support and a process liner surrounding the wafer support. The chamber lid comprises a high temperature lid module and a housing. The high temperature lid module has a bottom surface positioned adjacent a top surface of the process liner and a top surface. The housing is around the high temperature lid module and comprises a hollow cylindrical wall with a lower end adjacent the top surface of the cylindrical chamber wall, and an upper end. An elastomeric sealing O-ring is positioned between the upper end of the hollow cylindrical wall of the housing and the top surface of the high temperature lid module. An O-ring is positioned between the top surface of the cylindrical chamber wall and the lower end of the hollow cylindrical wall of the housing. The bottom surface of the high temperature lid module does not touch the top surface of the process liner when the process area is at atmospheric pressure and the housing flexes to allow the high temperature lid module to move within the housing to contact the top surface of the process liner when the process area is under reduced pressure.

In some embodiments, the hollow cylindrical wall of the housing comprises an outer hollow cylindrical wall, an inner hollow cylindrical wall, a lower annulus in contact with the outer hollow cylindrical wall and the inner hollow cylindrical wall, and an upper annulus connected to the inner hollow cylindrical wall. In one or more embodiments, the elastomeric sealing O-ring is positioned between a lower wall of the upper annulus and the top surface of the high temperature lid. In some embodiments, the outer hollow cylindrical wall, the lower annulus, the inner hollow cylindrical wall and the upper annulus are integrally formed. In one or more embodiments, the lower annulus is thinner than the outer hollow cylindrical wall, the inner hollow cylindrical wall and the upper annulus.

In some embodiments, the lower annulus, inner hollow cylindrical wall and upper annulus are integrally formed and the outer hollow cylindrical wall is separate. One or more embodiments further comprise an O-ring positioned between a top end of the outer hollow cylindrical wall and a lower surface of the lower annulus.

In some embodiments, the housing has enough flexibility to allow the movement of the high temperature lid module within the housing up to about 1 inch. In one or more embodiments, the high temperature lid module comprises a showerhead assembly including a plurality of apertures on the bottom surface. In some embodiments, expansion of the high temperature lid module upon heating does not create additional contact points between the high temperature lid module and the housing.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
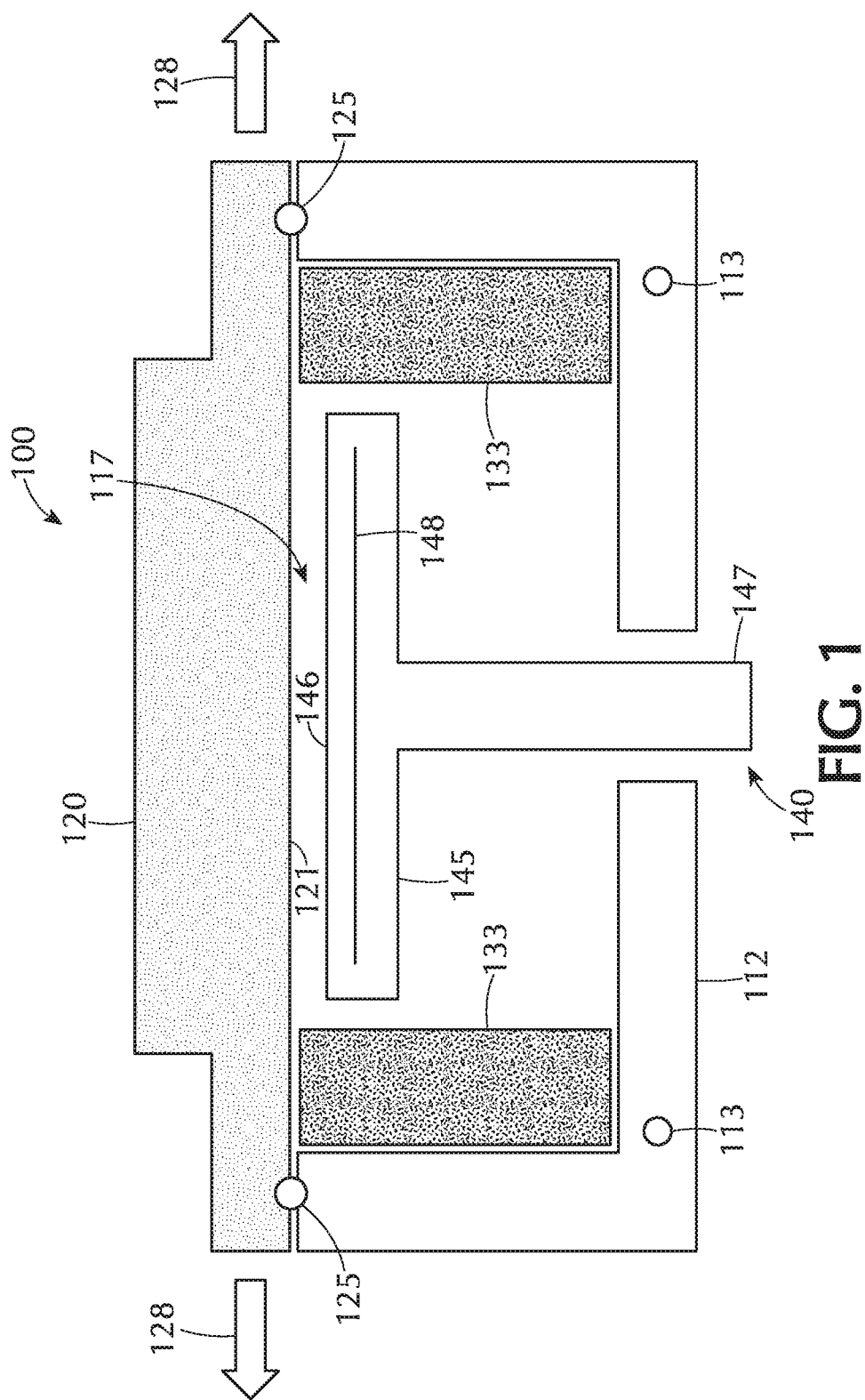
FIG. 1 shows a cross-sectional schematic view of a conventional processing apparatus.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

FIG. 1 shows a schematic representation of a conventional processing chamber 100. The processing chamber 100 includes a chamber body 112 and a lid assembly 120. The lid assembly 120 is disposed at an upper end of the chamber body 112. The processing chamber 100 and the associated hardware can be made of any suitable material including, but not limited to, aluminum, anodized aluminum, nickel plated aluminum, nickel plated aluminum 6061-T6, stainless steel, as well as combinations and alloys thereof, for example.

A seal is formed between the lid 120 and the chamber body 112 by, for example, an O-ring 125. The weight of the lid 120 and a reduced pressure in the chamber 100 will cause the lid 120 to move toward the upper portion of the chamber body 112, compressing the O-ring 125 and enhancing the seal.

A support assembly 140 is at least partially disposed within the chamber body 112. The support assembly 140 shown is made up of two parts, a wafer support 145 and a movable shaft 147. The movable shaft 147 can be moved vertically by, for example, an actuator motor, to position the top surface 146 of the wafer support 145 closer to or further from the lower surface 121 of the lid 120. The support assembly 140 may also include a wafer heater 148, shown as an electrode within the wafer support 145, but other wafer heaters 148 (e.g., a plurality of heat lamps) could also be employed.

The chamber body 112 may include components not shown, like a slit valve opening formed in a sidewall of the chamber body 112 to provide access to the interior of the processing chamber 100. The slit valve opening can be selectively opened and closed to allow access to the interior of the chamber body 112 by a wafer handling robot (not shown). In one or more embodiment, a wafer can be transported in and out of the processing chamber 100 through the slit valve opening to an adjacent transfer chamber and/or load-lock chamber, or another chamber within a cluster tool.

The chamber body 112 may also include a channel 113 formed therein for flowing a heat transfer fluid therethrough. The heat transfer fluid can be a heating fluid or a coolant and can be used to control the temperature of the chamber body 112 during processing and substrate transfer. Exemplary heat transfer fluids include, but are not limited to, water, ethylene glycol, or a mixture thereof. An exemplary heat transfer fluid may also include nitrogen gas.

The chamber body 112 can further include a liner 133 that surrounds the support assembly 140. The liner 133 is part of the "process kit" and may be removable for servicing and cleaning. The liner 133 can be made of a metal such as aluminum, or a ceramic material. However, the liner 133 can be any process compatible material. The liner 133 can be bead blasted to increase the adhesion of any material deposited thereon, thereby preventing flaking of material which results in contamination of the processing chamber 100. In one or more embodiments, the liner 133 includes one or more apertures 135 (shown in FIG. 6 and a pumping channel that is in fluid communication with a vacuum system. The apertures 135 may provide a flow path allowing process gases to be flowed into the processing chamber 100 and/or for the removal of gases from the processing chamber 100.

The processing chamber 100 may include a vacuum system with a vacuum pump and a throttle valve to regulate the flow of gases. The vacuum pump can be coupled to a vacuum port in a side or bottom of the chamber body 112 to allow fluid communication with the processing region within the processing chamber 100.

When the lid 120 of a processing chamber 100 is heated, the O-ring 125 is also heated. This can result in the failure (e.g., leaking, sticking and losing shape) of the elastomeric sealing material which makes up the O-ring 125. In addition, while heating the lid 120, the chamber body 112 which is in contact with the 120 lid needs to stay relatively cold. For example, the lid 120 may be heated to a temperature of about 250° C., while the chamber body 112 is kept at a temperature of about 65° C. This thermal difference between the hot lid and the relatively cold chamber body can cause the hot lid to expand outwardly 128. The expansion causes relative displacement of the lid 120 with respect to the chamber body 112 and can result in the creation of scratches and/or particles inside the chamber 100. Accordingly, some embodiments of the invention are directed to a chamber lid which minimizes the contact of hot lid parts to the relatively cold chamber body. Some embodiments move the sealing surfaces to relatively cold place of the lid.

Additionally, to keep the process area 117 temperature uniform, the hot lid 120 components may be allowed to touch the process kit components (e.g., process liner 133)

thereby promoting thermal uniformity. However, during installation of the lid 120, contact between the lid 120 and the process kit components can damage to the process kit components. To mitigate the potential for damage, embodiments of the invention allow for the lid 120 to move up and down relative to the process kit.

Some embodiments include a thin elastic component on the lid allowing the lid component to move up and down. When the parts are installed, there is enough distance between the lid and the process kit to prevent damage. Once the chamber is pumped down to vacuum, the pressure difference on the elastic components causes the lid to move toward and touch the process kit. The pressure difference does not cause permanent deformation of the elastic material while allowing enough movement for the lid component.

Figure 2:
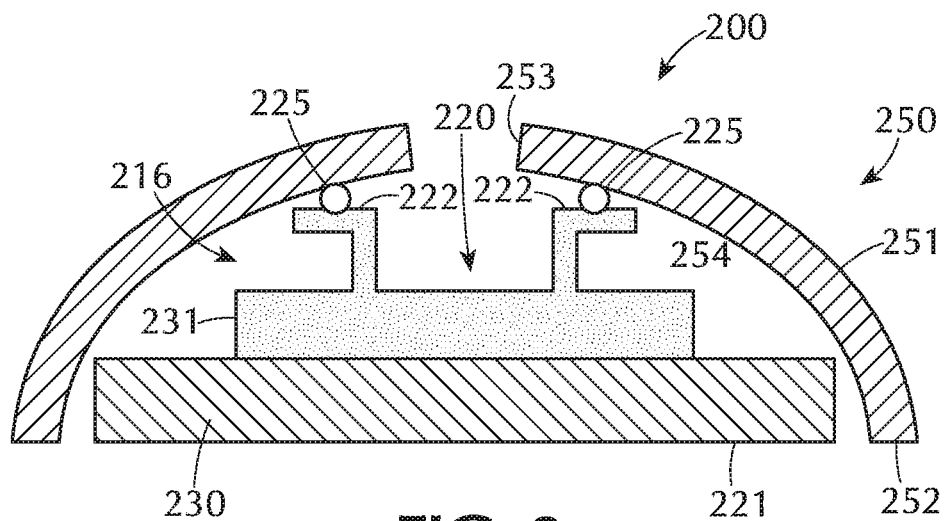
FIG. 2 shows a cross-sectional schematic view of a lid assembly in accordance one or more embodiment of the invention.

Accordingly, one or more embodiments of the invention are directed to lid assemblies 200 for use in a low-pressure processing chamber. Referring to FIG. 2, the lid assembly 200 includes a high temperature lid module 220 and a housing 250 surrounding the high temperature lid module 220. The housing 250 surrounds the high temperature lid module 220 but can have any desired shape. The housing shapes shown and described herein are merely exemplary and other shapes may be within the scope of the invention.

Figure 4:
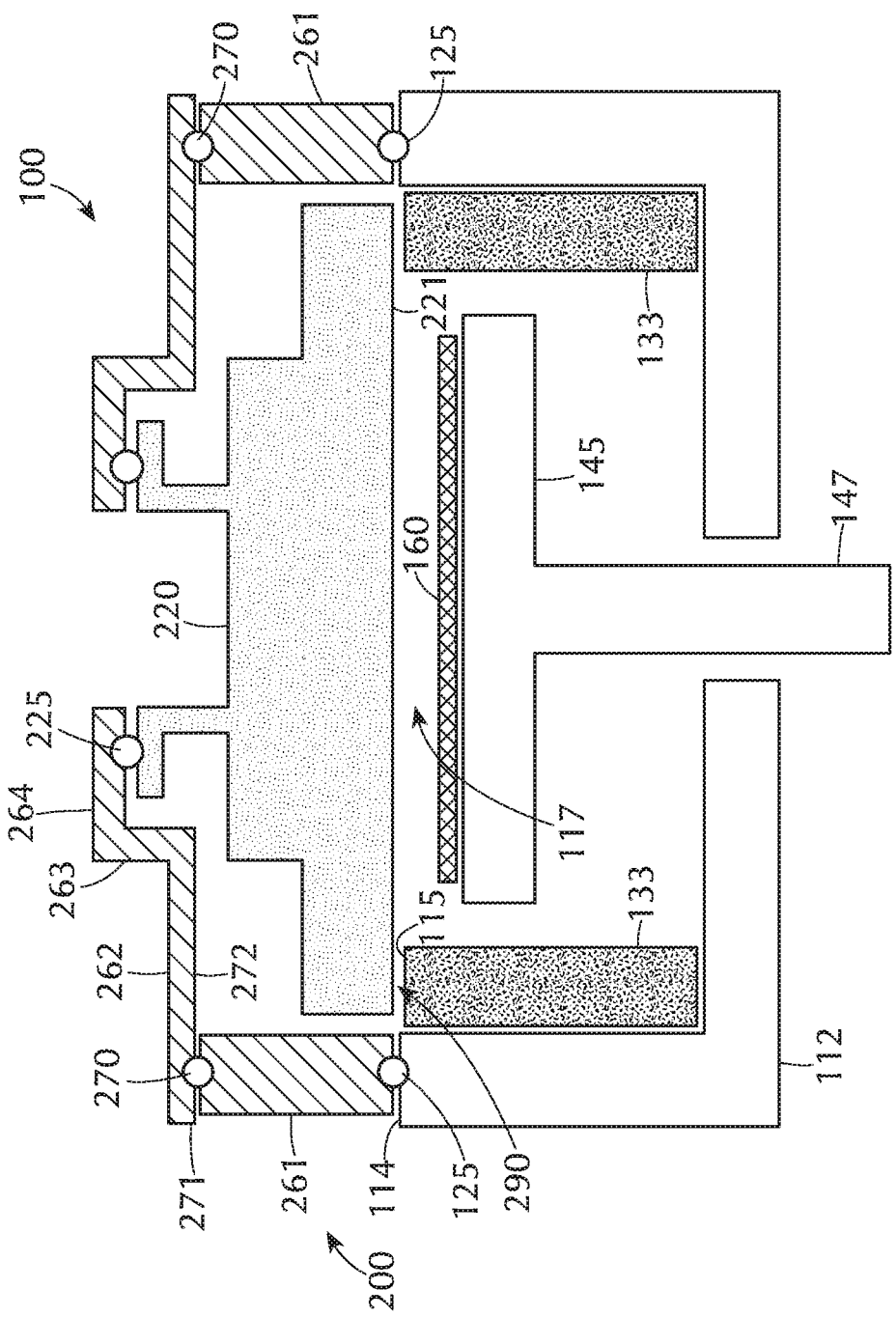
FIG. 4 show a cross-sectional schematic view of a processing chamber at atmospheric pressure in accordance one or more embodiment of the invention.

The high temperature lid module 220 can be a single integrated component or made up of a number of components. For example, the high temperature lid module shown in FIG. 2 includes a showerhead 230 and a gas source 231. The showerhead may include a plurality of aperture to allow gas to flow from the showerhead 230 to the process area 117 above a wafer 160 (as shown in FIG. 4). Those skilled in the art will understand that other components can be included in the high temperature lid module 220. For convenience of description, the Figures, other than FIG. 2, show the high temperature lid module 220 as a single component.

The shape and design of the high temperature lid module 220 can be any suitable shape depending on the specific component(s) involved. The shape shown in the Figures is merely representative of one possible shape and should not be taken as limiting the scope of the invention. The high temperature lid module 220 has a bottom surface 221 which can be positioned, for example, adjacent a processing kit (e.g., a process liner 133) of a processing chamber 100. The high temperature lid module 220 also includes a top surface 222 which can interact with the housing 250, as described below.

The housing 250 is around the high temperature lid module 220. Stated differently, the housing 250 surrounds the outer edges of the high temperature lid module 220 to minimize the area of the high temperature lid module 220 that is exposed to the atmosphere during processing. The housing 250 comprising a hollow cylindrical wall 251 with a lower end 252 to be positioned adjacent a processing chamber body 112 and an upper end 253.

An elastomeric sealing O-ring 225 is positioned between the upper end 253 of the hollow cylindrical wall 251 and the top surface 222 of the high temperature lid module 220. The O-ring 225 show in FIG. 2 is in contact with an inner surface 254 of the hollow cylindrical wall 251. The O-ring 225 creates a seal between the atmospheric side of the housing 250 and the inner region 216 between the housing 250 and the high temperature lid module 220.

The housing 250 is flexible, allowing the high temperature lid module 220 to move within the housing 250. For example, when the pressure below the high temperature lid module 220 is lower than atmospheric pressure, the module would move down. The housing 250 allows a degree of movement while retaining its initial shape so that when the pressure is equalized, the high temperature lid module 220 moves back to the original position. The amount of movement of the high temperature lid module 220 can vary. In some embodiments, the high temperature lid module 220 can move a distance from its initial position up to about 1 inch. In one or more embodiments, the high temperature lid module 220 can move in the range of about 0.1 inch to about 1 inch, or in the range of about 0.15 inch to about 0.5 inch, or in the range of about 0.2 inch to about 0.4 inches.

In addition to vertical movement of the high temperature lid module 220 relative to the housing 250, the high temperature lid module 220 may also expand as a result of heating. If the high temperature lid module 220 is at elevated temperature and the housing is relatively cool, the temperature differential would result in the expansion of high temperature lid module 220 relative to the housing 250. In some embodiments, the expansion of the high temperature lid module 220 causes an outer edge of the high temperature lid module 220 to touch or contact the inner surface 254 of the housing 250. In some embodiments, expansion of the high temperature lid module 220 upon heating does not create additional contact points between the high temperature lid module 220 and the housing 250.

Figure 3:
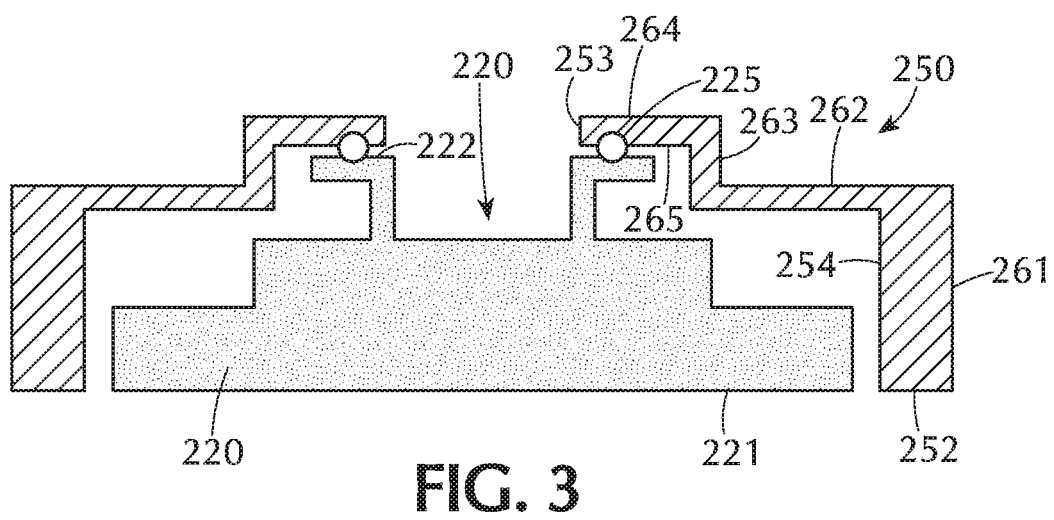
FIG. 3 shows a cross-sectional schematic view of a lid assembly in accordance one or more embodiment of the invention.

FIG. 3 shows another embodiment of the housing 250 in which the hollow cylindrical wall 251 is made up of several segments. Here the hollow cylindrical wall comprises an outer hollow cylindrical wall 261 and an inner hollow cylindrical wall 263. A lower annulus 262 in contact with the outer hollow cylindrical wall 261 and the inner hollow cylindrical wall 263. An upper annulus 264 is connected to the inner hollow cylindrical wall 263. In some embodiments, the elastomeric sealing O-ring 225 is positioned between a lower wall 265 of the upper annulus 264 and the top surface 222 of the high temperature lid module 220.

In the embodiment shown in FIG. 3, the outer hollow cylindrical wall 261, the lower annulus 262, the inner hollow cylindrical wall 263 and the upper annulus 264 are integrally formed. Meaning that these individual components are formed as a single piece.

FIG. 4 shows an embodiments of a processing chamber 100 including a chamber body and a chamber lid 200. The chamber body includes a cylindrical chamber wall 112 with a top surface 114 which encloses a process area 117. The process area 117 includes a wafer support 145, which is shown supporting a wafer 160, and a process liner 133 surrounding the wafer support 145. The chamber lid 200 comprises a high temperature lid module 220 having a bottom surface 221 positioned adjacent a top surface 115 of the process liner 133. The is a gap 290 between the top surface 115 of the process liner 133 and the bottom surface 221 of the high temperature lid module 220.

The embodiment of FIG. 4. Has a housing 250 where the lower annulus 262, inner hollow cylindrical wall 263 and upper annulus 264 are integrally formed and the outer hollow cylindrical wall 261 is a separate component. Those skilled in the art will understand that there are other configurations of integrally formed and separate sections depending on the number of segments, or turns, that make up the housing 250. For example, the outer cylindrical wall 261, lower annulus 262 and inner cylindrical wall 263 could be integrally formed with the upper annulus 264 separate. In some embodiments, the housing 250 is made up of one distinct component (e.g., the dome shape of FIG. 2), or two, three, four (e.g., FIG. 4), five, six, seven, eight, nine or more distinct sections, with any number of these distinct sections integrally formed.

As shown in FIG. 4, with the outer hollow cylindrical wall 261 a separate component, an O-ring 270 is positioned between a top end 271 of the outer hollow cylindrical wall 261 and a lower surface 272 of the lower annulus 262. This O-ring 270 may enable portions of the housing 250 to flex separately without breaking the seal between the process area and the atmosphere.

The thickness of the housing 250, or of portions of the housing, can be varied to make flexing easier or harder. In some embodiments, as shown in FIG. 4, the lower annulus 262 of the housing 250 is thinner than the upper annulus 264. Therefore, when the high temperature lid module 220 moves down, the housing 250 flexes around the lower annulus 262. This means that the lower annulus 262 portion could bend, or the connections to either the outer cylindrical wall 261 through the O-ring 270 or to the inner cylindrical wall may move or flex.

Figure 5:
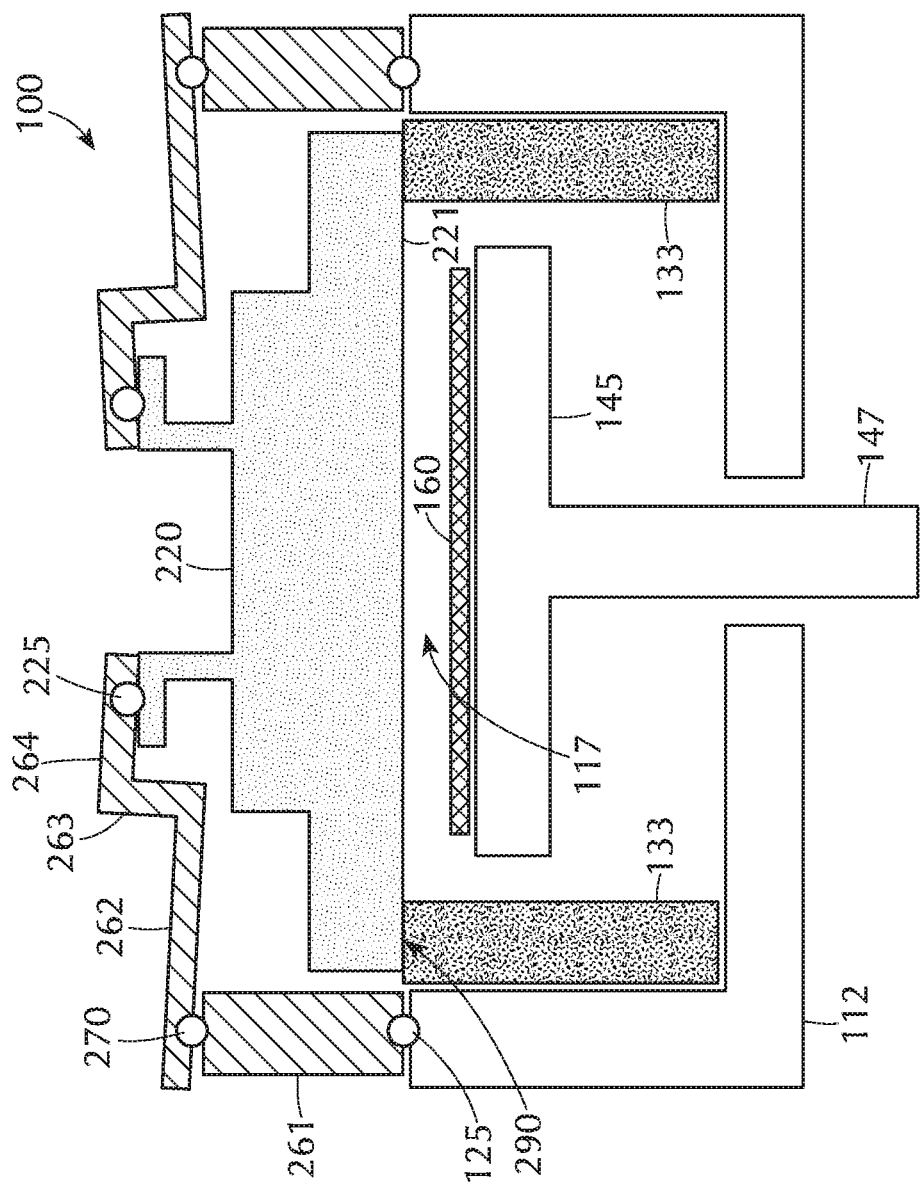
FIG. 5 show a cross-sectional schematic view of the processing chamber of FIG. 4 under reduced pressure conditions in accordance one or more embodiment of the invention.

When the process area 117 is not under decreased pressure, there is a gap 290 between the high temperature lid module 220 and the process liner 133. This allows the lid to be placed on the chamber without risking scratching or denting either the process liner 133 or the bottom surface 221 of the high temperature lid module 220. Stated differently, the bottom surface 221 of the high temperature lid module 220 does not touch the top surface 115 of the process liner 133 when the process area 117 is at atmospheric pressure. As shown in FIG. 5, the housing 250 flexes to allow the high temperature lid module 220 to move within the housing 250 to contact the top surface 115 of the process liner 133 when the process area 117 is under reduced pressure. Here, the gap 290 has become small to nonexistent so that there is direct contact between the high temperature lid 220 and the process liner 133 to enhance the uniformity of heating within the process chamber.

Figure 6:
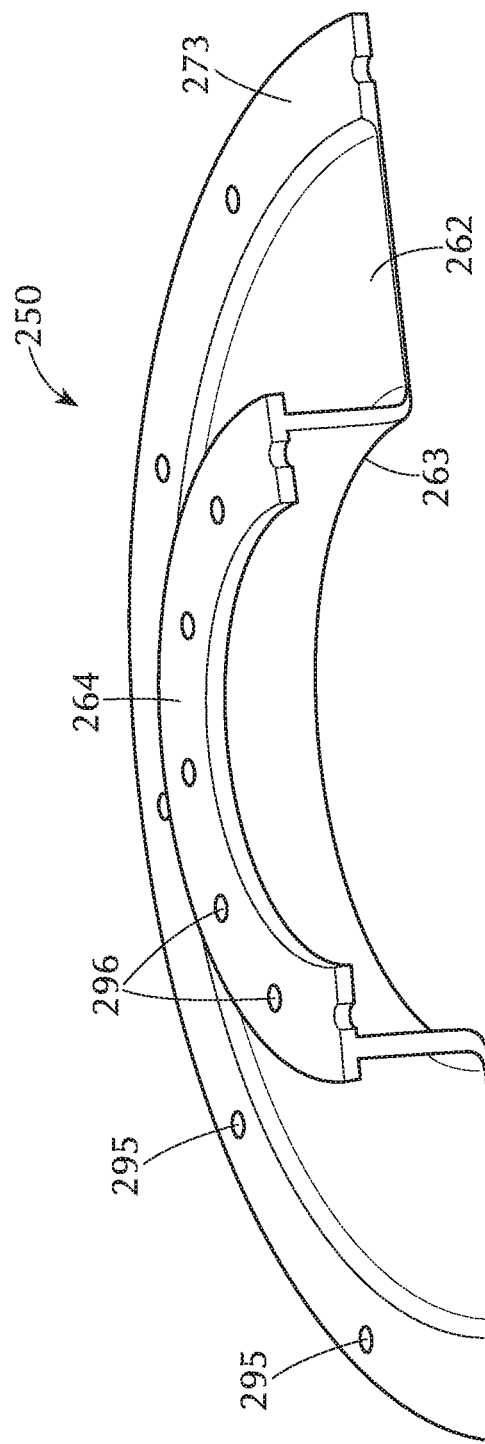
FIG. 6 shows a partial cross-sectional perspective view of a lid assembly in accordance with one or more embodiments of the invention.

FIG. 6 shows a cross-sectional perspective view of a portion of a housing 250 in accordance with one or more embodiment of the invention. Here, the housing 250 is an integrated component including a lower annulus 262, an inner hollow cylinder 263 and an upper annulus 264. A outer connector region 273 is shown around the outer peripheral edge of the lower annulus 262. The outer connector region 273 shown has a plurality of holes 295 through which the housing 250 can be connected to the top of the chamber or to the top of a an outer cylindrical wall 261. There are also a plurality of holes 296 in the upper annulus which can be used to connect the housing to the top surface of the high temperature lid module 220.

While the foregoing is directed to embodiments of the present invention, other and further embodiments of the invention may be devised without departing from the basic scope thereof, and the scope thereof is determined by the claims that follow.

What is claimed is:

1. A processing chamber comprising:
   a chamber body including a cylindrical chamber wall with a top surface, the cylindrical chamber wall enclosing a process area, the process area including a wafer support and a process liner surrounding the wafer support;
   a chamber lid comprising
   a high temperature lid module having a bottom surface positional adjacent a top surface of the process liner and wherein the high temperature lid module having a top surface,
   a housing around the high temperature lid module, the housing comprising a hollow cylindrical wall with a lower end adjacent the top surface of the cylindrical chamber wall, and an upper end, the hollow cylindrical wall comprising an outer hollow cylindrical wall, an inner hollow cylindrical wall, a lower annulus in connection with the outer hollow cylindrical wall and the inner hollow cylindrical wall, and an upper annulus connected to the inner hollow cylindrical wall and an elastomeric sealing O-ring positioned between the upper end of the hollow cylindrical wall of the housing and the top surface of the high temperature lid module; and an O-ring positioned between the top surface of the cylindrical chamber wall and the lower end of the hollow cylindrical wall of the housing, wherein the bottom surface of the high temperature lid module does not touch the top surface of the process liner when the process area is at atmospheric pressure and the housing flexes to allow the high temperature lid module to move within the housing to contact the top surface of the process liner when the process area is under reduced pressure.

2. The processing chamber of claim 1, wherein the elastomeric sealing O-ring is positioned between a lower wall of the upper annulus and the top surface of the high temperature lid module.

3. The processing chamber of claim 1, wherein the lower annulus, the inner hollow cylindrical wall and the upper annulus are integrally formed.

4. The processing chamber of claim 3, wherein the lower annulus is thinner than the outer hollow cylindrical wall, the inner hollow cylindrical wall and the upper annulus.

5. The processing chamber of claim 1, wherein the lower annulus, the inner hollow cylindrical wall and the upper annulus are integrally formed and the outer hollow cylindrical wall is separate.

6. The processing chamber of claim 5, further comprising a second O-ring positioned between a top end of the outer hollow cylindrical wall and a lower surface of the lower annulus.

7. The processing chamber of claim 1, wherein the housing has flexibility to allow movement of the high temperature lid module within the housing up to 1 inch.

8. The processing chamber of claim 1, wherein the high temperature lid module comprises a showerhead assembly.

9. The processing chamber of claim 1, wherein expansion of the high temperature lid module upon heating does not create additional contact points between the high temperature lid module and the housing.

10. A processing chamber comprising:
    a chamber body including a cylindrical chamber wall with a top surface, the cylindrical chamber wall enclosing a process area, the process area including a wafer support and a process liner surrounding the wafer support;
    a chamber lid comprising
    a high temperature lid module having a bottom surface positioned adjacent a top surface of the process liner and wherein the high temperature lid module having a top surface, a housing around the high temperature lid module, the housing comprising a hollow cylindrical wall with a lower end adjacent the top surface of the cylindrical chamber wall, and an upper end, the hollow cylindrical wall comprising an outer hollow cylindrical wall in connection with a lower annulus, the lower annulus in contact with an inner hollow cylindrical wall, the inner hollow cylindrical wall in contact with an upper annulus, the lower annulus, the inner hollow cylindrical wall and the upper annulus are integrally formed, and an elastomeric sealing O-ring positioned between the upper end of the hollow cylindrical wall of the housing and the top surface of the high temperature lid module;

and an O-ring positioned between the top surface of the cylindrical chamber wall and the lower end of the hollow cylindrical wall of the housing, wherein the bottom surface of the high temperature lid module does not touch the top surface of the process liner when the process area is at atmospheric pressure and the housing flexes to allow the high temperature lid module to move within the housing to contact the top surface of the process liner when the process area is under reduced pressure.

11. The processing chamber of claim 10, wherein the elastomeric sealing O-ring is positioned between a lower wall of the upper annulus and the top surface of the high temperature lid module.

12. The processing chamber of claim 10, wherein the lower annulus is thinner than the outer hollow cylindrical wall, the inner hollow cylindrical wall and the upper annulus.

13. The processing chamber of claim 10, further comprising a second O-ring positioned between a top end of the outer hollow cylindrical wall and a lower surface of the lower annulus.

14. The processing chamber of claim 10, wherein the housing has flexibility to allow movement of the high temperature lid module within the housing up to 1 inch.

15. The processing chamber of claim 10, wherein the high temperature lid module comprises a showerhead assembly.

16. The processing chamber of claim 10, wherein expansion of the high temperature lid module upon heating does not create additional contact points between the high temperature lid module and the housing.

* * * * *